(12) United States Patent
Harvey (10) Patent No.: US 7,068,106 B2
(45) Date of Patent: Jun. 27, 2006

(54) BIAS CURRENT CANCELLATION FOR DIFFERENTIAL AMPLIFIERS

(75) Inventor: Barry Harvey, Los Altos, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 135 days.

(21) Appl. No.: 10/858,702

(22) Filed: Jun. 2, 2004

(65) Prior Publication Data

US 2005/0270100 A1    Dec. 8, 2005

(51) Int. Cl.
*H03F 3/45*    (2006.01)

(52) U.S. Cl. ..................................... 330/261; 330/285

(58) Field of Classification Search ................ 330/261, 330/285, 296, 69
See application file for complete search history.

(56) References Cited

U.S. PATENT DOCUMENTS

| 5,128,564 A | | 7/1992 | Harvey et al. |
| 5,150,073 A | * | 9/1992 | Murari et al. ................ 330/261 |
| 5,550,512 A | * | 8/1996 | Fukahori ..................... 330/254 |
| 6,031,424 A | | 2/2000 | Fairgrieve |
| 6,066,987 A | * | 5/2000 | Lorenz ........................ 330/311 |

* cited by examiner

*Primary Examiner*—Henry Choe
(74) *Attorney, Agent, or Firm*—Fliesler Meyer LLP (57) ABSTRACT

Differential amplifiers are provided that substantially cancel the input bias currents at the inputs to the differential amplifiers. A circuit produces a compensation current that is substantially equal in magnitude but opposite in polarity to input bias currents associated with the first and second inputs of the differential amplifier. A further pair of transistors are used to replicate the compensation current, and to provide replicated compensation currents to the inputs of the differential amplifier, thereby substantially canceling the input bias currents at the inputs.

8 Claims, 7 Drawing Sheets

BIAS CURRENT CANCELLATION FOR DIFFERENTIAL AMPLIFIERS

FIELD OF THE INVENTION

Embodiments of the present invention relate to the field of integrated circuits, and more specifically to differential amplifiers.

BACKGROUND

Figure 1:
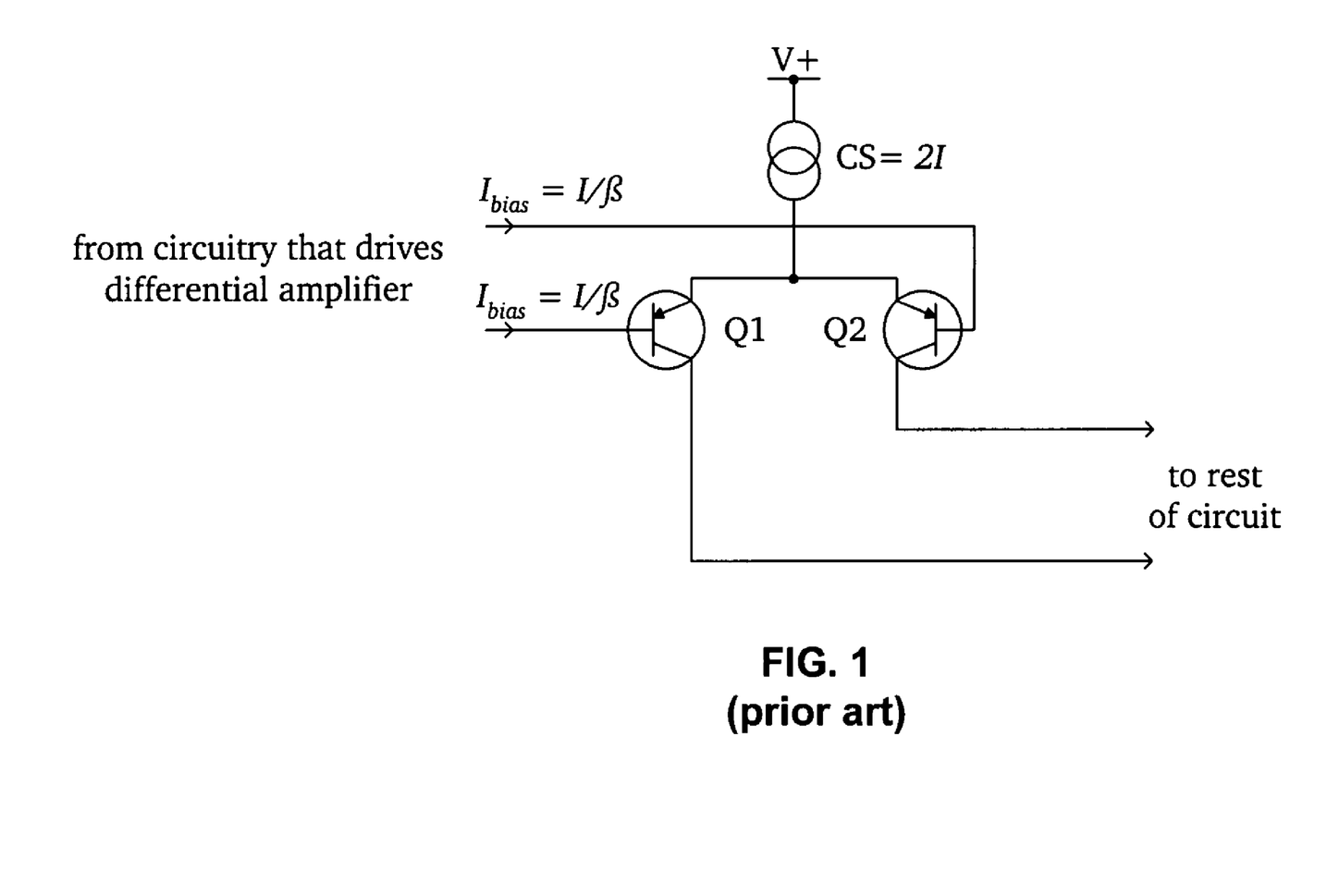
FIG. 1 is circuit diagram of a prior art differential amplifier.

FIG. 1 shows a conventional differential amplifier. The differential amplifier includes a differential pair of PNP bipolar junction transistors (BJT transistors) Q1 and Q2 with the amplifier inputs received at their respective bases, the amplifier outputs provided at their respective collectors, and their emitters connected to a current source CS (e.g., 2I). The input bias currents $I_{bias}$ for transistors Q1 and Q2 in balance (assuming they are substantially identical transistors) are each equal to the current I divided by the current gain β (i.e., $I_{bias}=I/β$). In practice, such bias currents (i.e., I/β) may be too large, inducing undesirable offsets in the circuitry that drives the differential amplifier. Accordingly, it would be desirable to provide a differential amplifier that does not produce such undesirable offsets in the circuitry driving the differential amplifier.

SUMMARY OF THE PRESENT INVENTION

Embodiments of the present invention are directed to differential amplifiers that substantially cancel input bias currents. By canceling the bias currents, undesirable offsets in the circuitry driving the differential amplifier are substantially eliminated.

In accordance with an embodiment of the present invention, a differential amplifier includes a differential pair of transistors. A first one of the transistors includes a base connected to a first input of the differential amplifier, a collector connected to a first output of the differential amplifier, and an emitter. A second one of the transistors including a base connected to a second input of the differential amplifier, a collector connected to a second output of the differential amplifier, and an emitter. The differential amplifier also includes a circuit that produces a compensation current that is substantially equal in magnitude but opposite in polarity to the input bias currents associated with the first and second inputs of the differential amplifier. Each of a further pair of transistors replicates the compensation current. One of the further pair of transistors provides a replicated compensation current to the first input of the differential amplifier to thereby substantially cancel the input bias current at the first input. The other one of the further pair of transistors provides a replicated compensation current to the second input of the differential amplifier to thereby substantially cancel the input bias current at the second input. In this manner, the input bias currents of the differential amplifier are substantially canceled.

Further embodiments and details, and the features, aspects, and advantages of the present invention will become more apparent from the detailed description set forth below, the drawings and the claims.

DETAILED DESCRIPTION

Embodiments of the present invention are directed to differential amplifiers in which the input bias currents of are substantially canceled. As will be explained below, this is accomplished by generating currents that are substantially equal to the input bias currents, but with an opposite polarity, and using the generated currents to substantially cancel the input bias currents.

Figure 2:
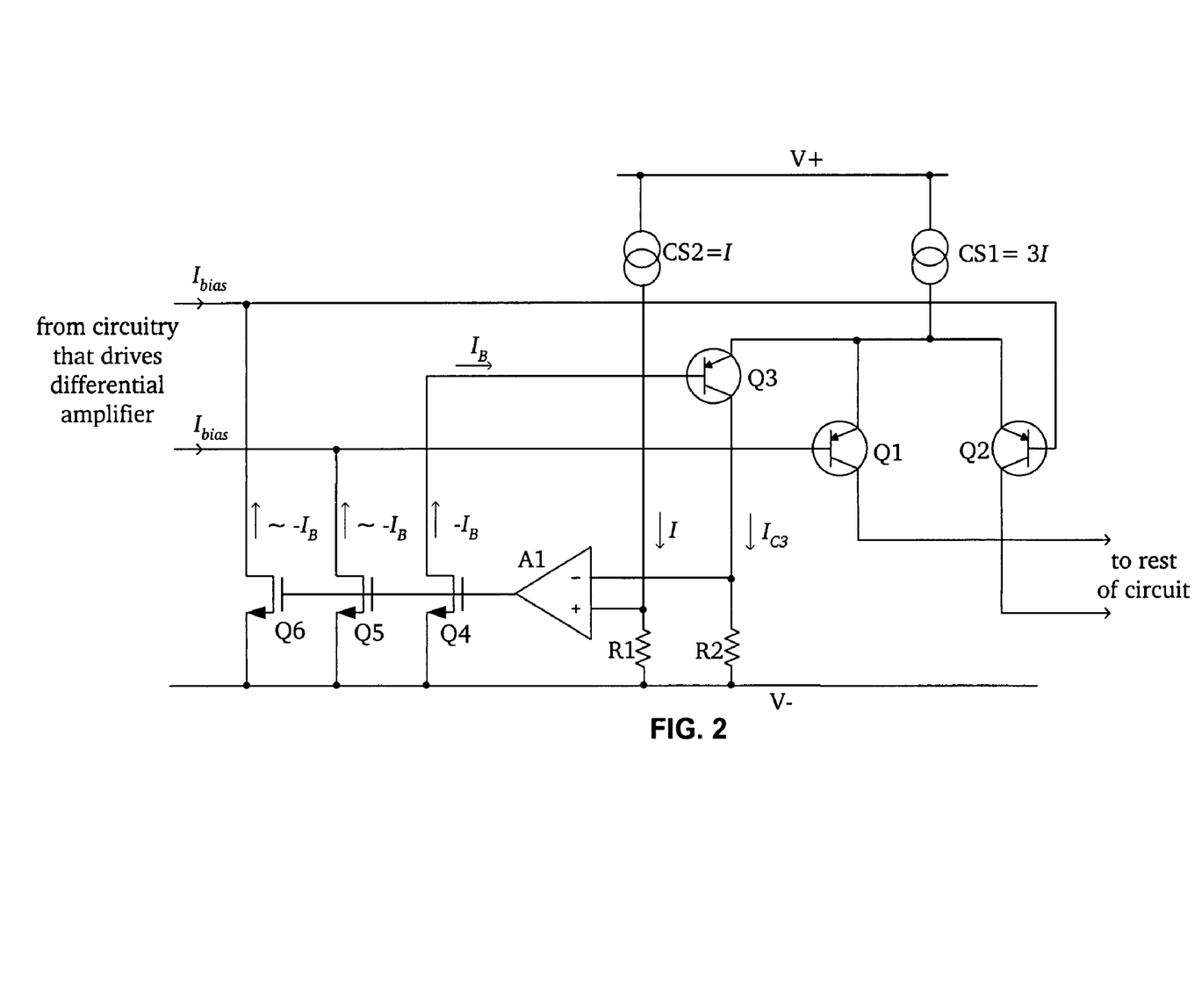
FIG. 2 is a circuit diagram of a differential amplifier according to an embodiment of the present invention.

FIG. 2 is a circuit diagram of a differential amplifier according to an embodiment of the present invention. The differential amplifier is shown as including a differential pair of PNP BJT transistors Q1 and Q2, and an additional BJT transistor Q3 (acting as a sense transistor) all having their emitters connected together. A current source CS1 (e.g., 3I) is connected between the emitters of transistors Q1, Q2 and Q3 and a high voltage rail (e.g., V+). A resistor R2 connects the collector of transistor Q3 to a low voltage rail (e.g., V−). A further resistor R1 and a further current source CS2 (e.g., I) are used to produce a reference voltage of I*R1. An amplifier A1 (e.g., an operational amplifier) compares transistor Q3's collector current voltage drop across resistor R2 (i.e., $I_{C3}$*R2) to the reference voltage drop (i.e., I*R1). Assuming that R1=R2 (which is not necessary), if the collector current of transistor Q3 ($I_{C3}$) is less than the reference current (I), then the voltage drop across resistor R2 will be less than the voltage drop across resistor R1, thereby causing the output of the amplifier A1 to rise. This will cause transistor Q4 to turn on harder and supply more current into the base of transistor Q3.

In this manner, amplifier A1 adjusts the gate voltage of transistor Q4 so as to equalize the voltage drop across resistors R1 and R2. Stated another way, the amplifier A1 adjusts the gate voltage of transistor Q4 such that an appropriate bias current is provided to the base of transistor Q3 to cause the voltage drop across resistor R2 to equal the voltage drop across resistor R1. In this manner, if R1=R2, then transistor Q3's collector current ($I_{C3}$) will be made to equal the reference current (I).

Transistors Q5 and Q6 are connected in a common gate and a common source configuration with transistor Q4, causing all of their drain currents to be substantially equal (assuming transistors Q4, Q5 and Q6 are substantially identical transistors). Accordingly, transistors Q5 and Q6 will replicate the current supplied by transistor Q4, thereby causing substantially identical negative copies of transistor Q3's base current to be provided to the base inputs of transistors Q1 and Q2 (which are connected to the inputs of the differential amplifier).

Thus, at the balance point (where the voltage drop across R1 equals the voltage drop across R2), identical copies of transistor Q3's base current are supplied into the bases of transistors Q1 and Q2. Additionally, transistor Q3's collector current is very nearly equal to its emitter current, and at overall balance transistors Q1, Q2 and Q3 will rest at substantially equal bias currents. This means that their base currents will be substantially equal, and the current from transistor Q4 will be replicated by transistors Q5 and Q6, providing for nearly perfect input bias current compensation (i.e., cancellation) to transistors Q1 and Q2.

In accordance with an embodiment of the present invention, the collectors of transistors Q1 and Q2's are biased close to the low voltage rail (e.g., V−) so as to place equal collector emitter voltages ($V_{CE}$) across transistors Q1, Q2 and Q3. This would provide matching of Early-effect errors on base currents and make the compensation accurate for a wide range of input voltages. Further, while it is not strictly necessary, in accordance with an embodiment of the present invention the geometry of transistor Q3 and its operating current are made to match that of transistors Q1 and Q2 so that their betas ($\beta$) and therefore the compensation is optimally matched.

As just explained, the amplifier A1 will cause the voltage drop across resistor R1 to match the voltage drop across R2. However, this does not necessarily mean that resistors R1 and R2 must be equal. Rather, this only means that the value of I*R1 will match $I_{C3}$*R2. Accordingly, the reference current I provided by the current source CS2 may be reduced in value to lessen power consumption with an appropriate increase in the value of resistor R1. Similarly the current 3I provided by the current source CS1 may be somewhat reduced to save power by reducing transistor Q3's quiescent current, with an appropriate increase in the value of resistor R2.

In the embodiment of FIG. 2, the output of the amplifier A1 adjusts the gate voltage of transistor Q4 so as to equalize the voltage drop across resistors R1 and R2. In accordance with another embodiment of the present invention, shown in FIG. 3, the output of the amplifier A1 adjusts the voltage at the source of transistor Q4 so as to equalize the voltage drop across resistors R1 and R2, while the gates of transistors Q4, Q5 and Q6 receive a constant bias voltage. It is noted that with this embodiment, the inputs to the differential amplifier may not reach the low voltage rail.

Figure 3:
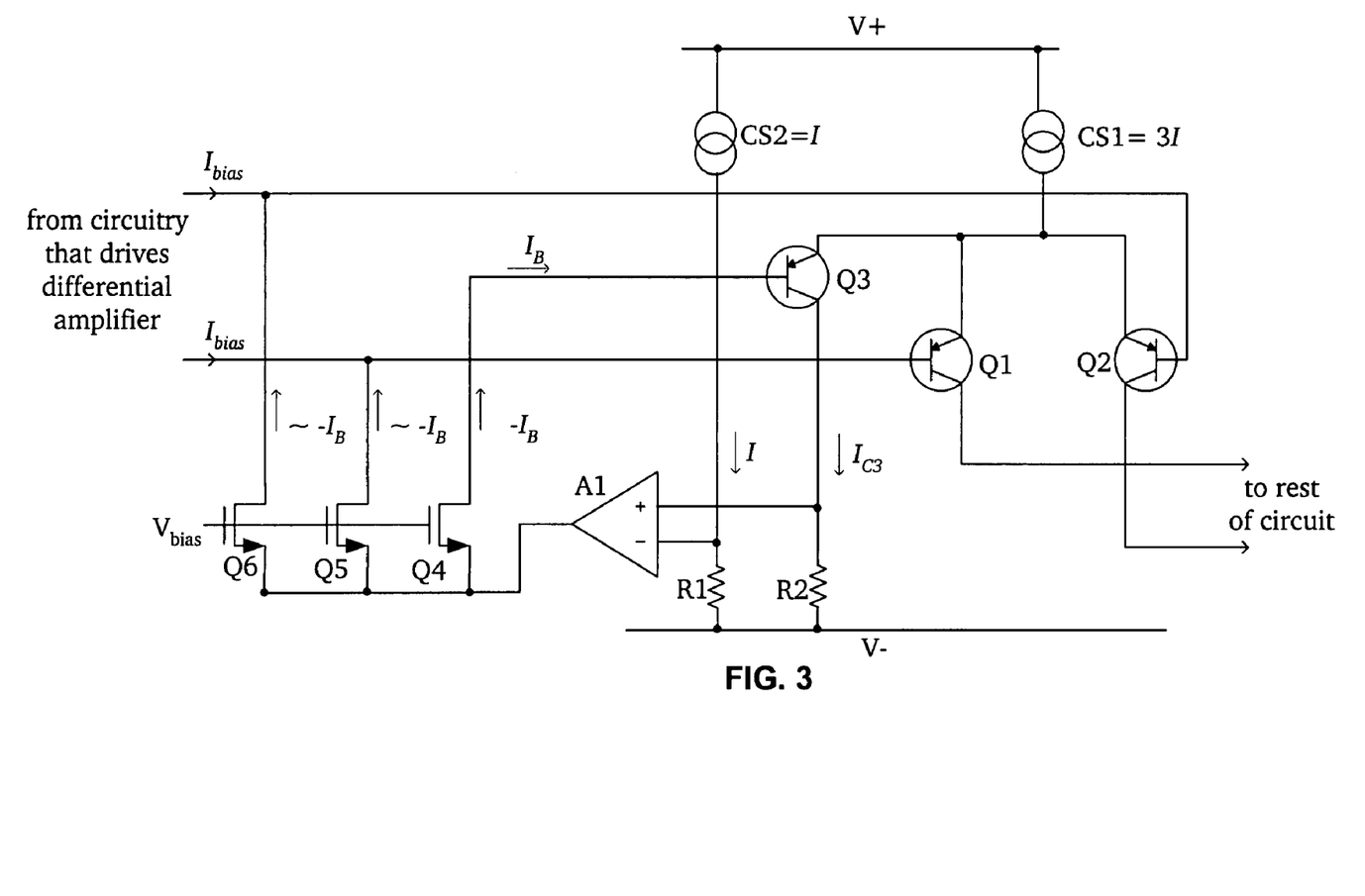
FIG. 3 is a circuit diagram of a differential amplifier according to an alternative embodiment of the present invention.
Figure 4:
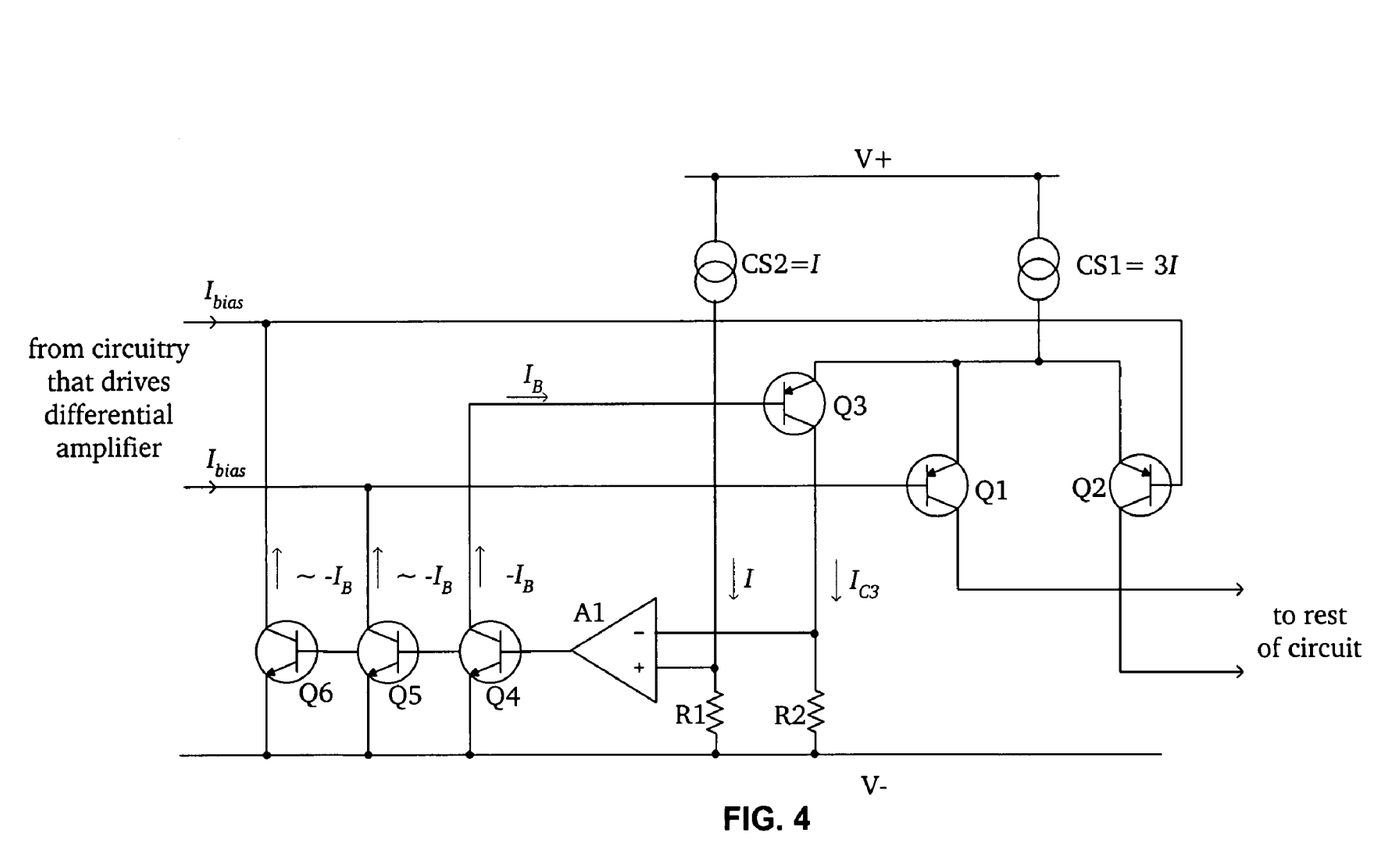
FIG. 4 is a circuit diagram of a differential amplifier that is similar to the differential amplifier of FIG. 2, but with BJT transistors replacing MOS transistors, in accordance with an embodiment of the present invention.
Figure 5:
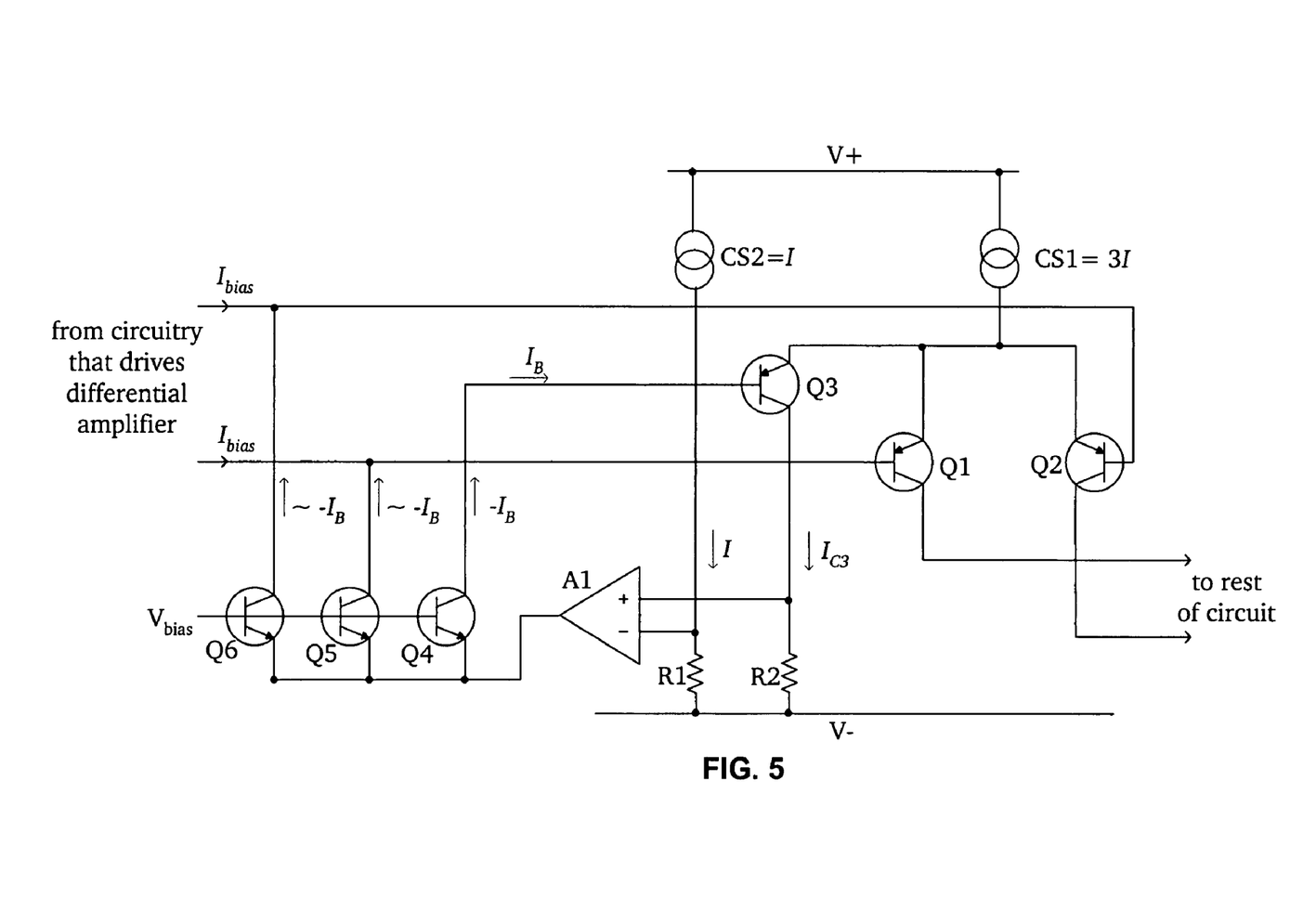
FIG. 5 is a circuit diagram of a differential amplifier that is similar to the differential amplifier of FIG. 3, but with BJT transistors replacing MOS transistors, in according with an embodiment of the present invention.

In the embodiment shown in FIGS. 2 and 3, transistors Q4, Q5 and Q6 are metal-oxide semiconductor (MOS) transistors. A major advantage to using MOS devices for transistor Q4, Q5 and Q6 is that they will continue their bias current cancellation within millivolts of the low voltage rail (e.g., V−). However, in accordance with an embodiment of the present invention, transistors Q4, Q5 and Q6 can be BJT devices, as shown in FIGS. 4 and 5. In these alternative embodiments, it is preferable to keep the collector-emitter voltages of transistors Q4, Q5 and Q6 above about 0.25 volts.

In FIGS. 2 and 4, resistors R1 and R2, and the sources of transistors Q4, Q5 and Q6, are shown as being connected to the same voltage rail (e.g., V−). However, this is not necessary. More specifically, in accordance with embodiments of the present invention, transistors Q4, Q5 and Q6 can be connected to a different voltage rail than the rail to which resistors R1 and R2 are connected.

Resistors R1 and R2 can be implemented using discrete resistors that include a resistive material, such as with a poly-resistor. Alternatively, resistors R1 and R2 will be implemented using transistors, e.g., a MOS device with a controlled gate voltage (or a BJT device with a controlled base voltage) that puts the device in the triode region, thereby causing it to act as a resistor.

In FIGS. 2 and 3, transistors Q1, Q2 and Q3 are shown as being PNP transistors, while transistors Q4, Q5 and Q6 are shown as being NMOS transistors. However, in accordance with embodiments of the present invention, the transistors, current sources, and supply polarities can all be inverted together with no alteration to circuit behavior. More specifically, transistors Q1, Q2 and Q3 can be NPN transistors connected through a current source to a low voltage rail, while transistors Q4, Q5 and Q6 are PMOS transistors connected to a high voltage rail.

In FIGS. 4 and 5 transistors Q1, Q2 and Q3 are shown as being PNP transistors, while transistors Q4, Q5 and Q6 are shown as being NPN transistors. However, in accordance with embodiments of the present invention, the transistors, current sources, and supply polarities can all be inverted together with no alteration to circuit behavior. More specifically, transistors Q1, Q2 and Q3 can be NPN transistors connected through a current source to a low voltage rail, while transistors Q4, Q5 and Q6 are PNP transistors connected to a high voltage rail.

It is also within the scope of the present invention that the metal semiconductor (MES) transistors can be used in place of MOS transistors.

Figure 6:
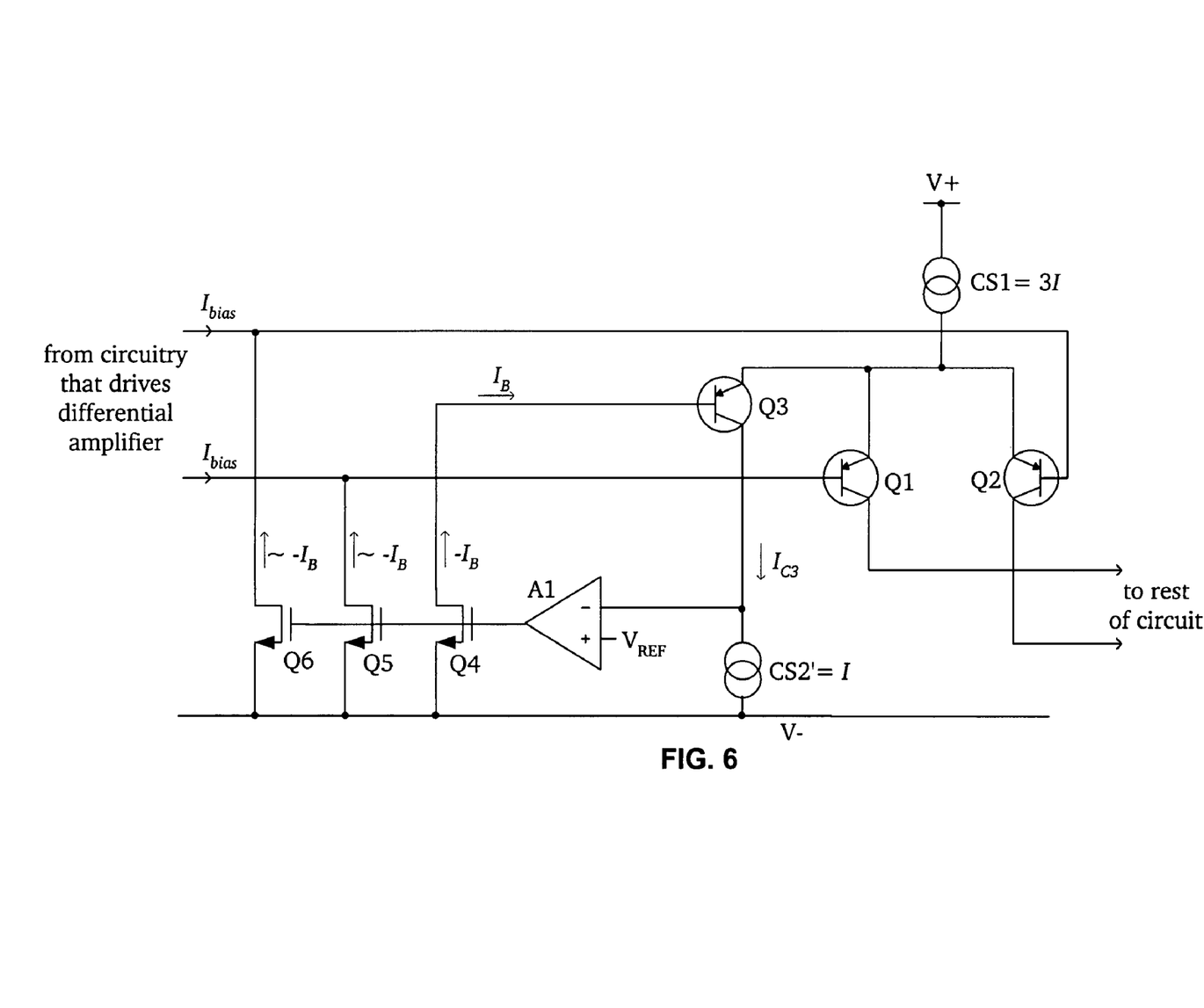
FIG. 6 is a circuit diagram of a differential amplifier that is similar to the differential amplifier of FIG. 2, but with modifications in accordance with an embodiment of the present invention.
Figure 7:
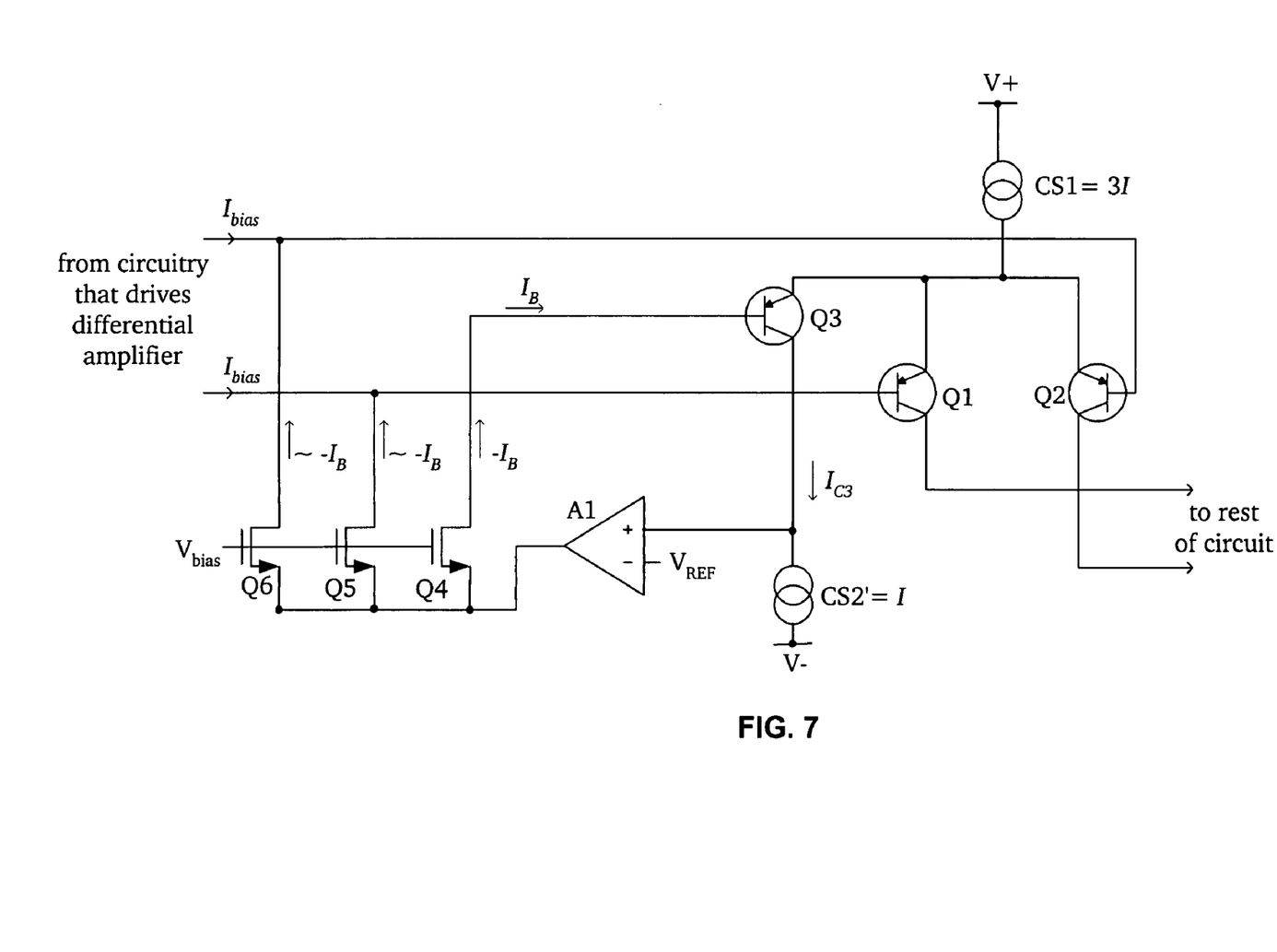
FIG. 7 is a circuit diagram of a differential amplifier that is similar to the differential amplifier of FIG. 3, but with modifications in accordance with an embodiment of the present invention.

In the above described embodiments, the purpose of current source CS2 and resistor R1 is to provide a reference voltage (at one of the inputs to the amplifier A1) that can be compared to transistor Q3's collector current ($I_{C3}$) voltage drop across resistor R2 (provided to the other input of the amplifier A1). In accordance with alternative embodiments of the present invention, shown in FIGS. 6 and 7, a fixed reference voltage ($V_{REF}$) is used in place of resistor R1 and current source CS2, and a current source CS2' is used in place of resistor R2. In these alternative embodiments, the loop including transistor Q3, amplifier A1 and transistor Q4 will cause transistor Q3's collector current to equal the reference current provided by current source CS2' (e.g., $I_{C3}=I$). The rest of the circuits will function in the same manners as described above. It is also within the scope of the present invention that the embodiments of FIGS. 3 and 4 can be modified in similar manners.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. A differential amplifier, comprising:
   a first transistor including a base connected to a first input of the differential amplifier, a collector connected to a first output of the differential amplifier, and an emitter;

a second transistor including a base connected to a second input of the differential amplifier, a collector connected to a second output of the differential amplifier, and an emitter;

a third transistor including a base, a collector, and an emitter;

a first current source connected between a first voltage rail and the emitters of the first, the second and the third transistors;

a first resistor including a first terminal and a second terminal, the first terminal of the first resistor connected to a second voltage rail;

a second current source connected between the first voltage rail and the second terminal of the first resistor;

a second resistor including a first terminal and a second terminal, the first terminal of the second resistor connected to the second voltage rail, the second terminal of the second resistor connected to the collector of the third transistor;

an amplifier having a first input connected to the second terminal of the first resistor, a second input terminal connected to the second terminal of the second transistor, and an output; and a fourth, a fifth and a sixth transistor each having a gate, a drain and a source, the gates of the fourth, the fifth and the sixth transistors each connected to the output of the amplifier, the sources of the fourth, the fifth and the sixth transistors connected together, the drain of the fourth transistor connected to the base of the third transistor, the drain of the fifth transistor connected to the base of the first transistor, and the drain of the sixth transistor connected to the drain of the second transistor.

2. The differential amplifier of claim 1, wherein the sources of the fourth, the fifth and the sixth transistors are connected to the second voltage rail.

3. The differential amplifier of claim 1, wherein the sources of the fourth, the fifth and the sixth transistors are connected to a third voltage rail.

4. The differential amplifier of claim 1, wherein:
the first, the second and the third transistors are PNP bipolar junction transistors; and
the fourth, the fifth and the sixth transistors are NMOS transistors.

5. The differential amplifier of claim 1, wherein:
the first, the second and the third transistors are NPN bipolar junction transistors; and
the fourth, the fifth and the sixth transistors are PMOS transistors.

6. The differential amplifier of claim 1, wherein the collectors of the first and the second transistors are biased close to the second voltage rail.

7. The differential amplifier of claim 1, wherein the first input of the amplifier is a non-inverting input, and the second input of the amplifier is an inverting input.

8. A differential amplifier, comprising:
a first bipolar junction transistor including a base connected to a first input of the differential amplifier, a collector connected to a first output of the differential amplifier, and an emitter;

a second bipolar junction transistor including a base connected to a second input of the differential amplifier, a collector connected to a second output of the differential amplifier, and an emitter connected to the emitter of the first transistor;

a circuit that produces a compensation current that is substantially equal in magnitude but opposite in polarity to input bias currents associated with the first and second inputs of the differential amplifier; and a first and a second transistor that each replicate the compensation current, the first transistor providing a replicated compensation current to the first input of the differential amplifier to thereby substantially cancel the input bias current at the first input, the second transistor providing a replicated compensation current to the second input of the differential amplifier to thereby substantially cancel the input bias current at the second input.

* * * * *